United States Patent [19]
Lee

[11] Patent Number: 6,060,356
[45] Date of Patent: May 9, 2000

[54] METHOD OF FABRICATING VIRTUAL GROUND SSI FLASH EPROM CELL AND ARRAY

[76] Inventor: William W. Y. Lee, 101 Alma St., Apt. 1001, Palo Alto, Calif. 94301

[21] Appl. No.: 09/175,154

[22] Filed: Oct. 19, 1998

[51] Int. Cl.[7] .................................................. H01L 21/336
[52] U.S. Cl. ........................................... 438/257; 438/266
[58] Field of Search .................................... 438/257, 258, 438/266, 363, 264, 201, 211

[56] References Cited

U.S. PATENT DOCUMENTS

| | | | |
|---|---|---|---|
| 5,143,860 | 9/1992 | Michell et al. | 438/262 |
| 5,242,848 | 9/1993 | Yeh | 438/266 |

Primary Examiner—David Nelms
Assistant Examiner—Brook Kebede
Attorney, Agent, or Firm—Claude A. S. Hamrick; Emil Chang; Oppenheimer Wolff & Donnelly

[57] ABSTRACT

A compact, low current flash EPROM cell that is scaleable to dee-submicron levels for future generations of flash memory arrays is disclosed. This flash memory cell can be fabricated using a twelve masks, triple-poly, salicided process. Source-side injection for programming and poly-to-poly erasing demand very little current and power and such demand can easily be met by charge pump techniques. A select gate in series with the cell channel guarantees enhancement threshold and its sell-alignment and constant channel length will give uniform electrical characteristics in every respect. A virtual ground array fabricated using a self-aligned salicidation process provides a compact cell with high access speed. The cell area is approximately 3F×2F where F is a given minimum dimension.

26 Claims, 7 Drawing Sheets

| Step | Process Operation | Purpose & Comment |
|---|---|---|
| 1 | Start with p-Si substrate and grow initial oxide to 2000 A; mask and deep n-well oxide etch; | Define deep n-well |
| 2 | Phosporous implantation and drive in at 1100 degree celius; | Deep n-well drive-in |
| 3 | Mask for p-well, oxide etch, and boron implant; | Define and dope p-well regions for array and periphery |
| 4 | Mask for n-well, oxide etch, and phosphorous implant; | Define and dope n-well regions for periphery |
| 5 | Drive in at 1050 degree celius; oxide etch to bare silicon; | Diffuse n and p wells |
| 6 | Grow pad oxide and deposit nitride; | Define active areas |
| 7 | Mask for active areas; etch oxide & nitride; boron field implant; grow LOCOS oxide 4000 A; | Grow field oxide |
| 8 | Etch off nitride and pad oxide; grow gate oxide 120 A; | Grow oxide for floating gate |
| 9 | Deposit composite poly 2000 A; phosphorous doping; deposit nitride 2000 A | Floating gate poly |
| 10 | Mask for floating gate; etch nitride and poly films; | Pattern floating gate stripes |
| 11 | Grow thermal oxide, ~300 A on poly side walls and 120 A on substrate | Grow tunnel oxide and gate oxide for select gate and CMOS devices |
| 12 | Mask for Vt adjustment; implant boron; | Adjust Vt for SG and CMOS devices |
| 13 | Deposit poly film 4000 A; phosphorous dope; | Select gate poly formation |
| 14 | Mask for RIE anisotropic etch; | Form poly 2 spacers and its pads; periphery area is covered |

Fig. 1a

| Step | Process Operation | Purpose & Comment |
|---|---|---|
| 15 | Mask to cover left side spacers in the array and CMOS areas; isotropic poly etch; | Etch out right side poly 2 spacer |
| 16 | RIE oxide etch | Use the FG and SG poly as a mask to etch the field oxide to silicon |
| 17 | Implant arsenic; | Form source and drain diffusion in array |
| 18 | Grow SG side wall oxide (1000 A); Deposit oxide 1000 A; RIE etch to bare FG surface; | Form additional oxide spacer on SG |
| 19 | Phosphoric acid nitride etch; | Expose bare FG surface |
| 20 | Deposit composite ONO film; | Form inter-poly dielectric |
| 21 | Deposit poly 3 (2000 A) and oxide (1000 A); mask for word line; | Word line poly |
| 22 | Plasm etch WL oxide, poly 3, and ONO; PR strip; | Stopping at FG surface |
| 23 | RIE etch FG, using WL and SG as mask; SG is protected by oxide spacers; | Form isolated individual poly 1 islands; |
| 24 | Mask for n-channel gate; RIE poly etch; | Form n-channel gates from poly 2 |
| 25 | Phosphorous implant; | LDD implant for n-channel devices |
| 26 | Deposit oxide 1000 A; RIE oxide etch; | Form oxide spacers for n-channel devices and FG edges |
| 27 | Arsenic implant | Form source and drain regions for n-channel devices |
| 28 | Mask for p-channel devices; poly etch | Form p-channel gates from poly 2 |
| 29 | BF2 implant; | Form source and drain regions for n-channel devices |

Fig. 1b

| Step | Process Operation | Purpose & Comment |
|------|-------------------|-------------------|
| 30 | Deposit titanium film (500 A); RTA 500 degree celius in nitrogen; | Start salicidation process, forming C49TiSi$_2$ |
| 31 | Wet chemical etch; | Remove unreacted Ti |
| 32 | RTA anneal 750 degree celius; | Form C54 TiSi$_2$ over WL, source and BL and in the periphery |
| 33 | Deposit BPSG 3000 A; reflow; | Form ILD |
| 34 | Mask for contact; oxide etch; | Form contacts |
| 35 | Deposit metal composits Ti/TiN/Al; | Metal 1 film |
| 36 | Mask for metal; RIE etch metal; | For metal lines |

Fig. 1c

METHOD OF FABRICATING VIRTUAL GROUND SSI FLASH EPROM CELL AND ARRAY

FIELD OF THE INVENTION

The present invention generally relates to flash memory cells and arrays, and, in particular, to flash EPROM cells and arrays.

BACKGROUND OF THE INVENTION

Single transistor non-volatile electrically alterable memory devices where bits can be individually programmed but collectively erased are known as flash EPROM memory devices. A representative example now in production is described in U.S. Pat. No. 5,242,848. The floating gate of the flash cell as taught in that patent disclosure is strongly coupled with the deep diffusion of the bit line, but is only weakly coupled to the word line through a thick LOCOS oxide grown on the floating gate. The polysilicon word line serves as an erase line at the bird's beak of the floating gate and also as a select gate which allows for programming by source-side injection.

Such a cell design, although viable, has a number of short comings. The large lateral drain diffusion needed for coupling requires a large fraction of the cell area, leaving only a small channel length to the floating gate for control of the channel. Since the field oxide edges can not be self-aligned to any of the gates, allowances must be made for misalignment, variations in diffusion line width and select gate length, and waste in cell area. All these features make it difficult to scale the device down, especially in the deep sub-micron regime where dimensional uncertainty must comprise only a small fraction of the overall geometry.

Therefore, it would be desirable to have a method for manufacturing of EPROM memory cells that is scaleable to deep-submicron levels using self alignment techniques and have a resulting memory array that requires low current for programming the memory cells.

SUMMARY OF THE INVENTION

It is therefore an object of the present invention to provide a method for fabricating memory cells for a memory array using self alignment techniques to allow scaling of the device, to eliminate source corner misalignment effect, and to provide cells having uniform electrical characteristics.

It is another object of the present invention to provide a method for fabricating memory cells for a memory array having select gates for selecting one or more memory cells for program or erase operations.

It is still another object of the present invention to provide a method for fabricating memory cells for a memory array requiring only low current for source side injection in programming the memory cells.

It is yet another object of the present invention to provide a method for fabricating memory cells for a memory array that does not require high voltage on the source or bit line for the erase operation.

Briefly, the present invention discloses a compact, low current flash EPROM cell that is scaleable to deep-submicron levels for future generations of flash memory cells. This flash memory cell can be fabricated using a twelve masks, triple-poly, salicided process. Source-side injection for programming and poly-to-poly erasing demand very little current and power and such demand can easily be met by charge pump techniques. A select gate in series with the cell channel guarantees enhancement threshold. Self-alignment of both the spacer and drain/source regions and constant channel will give uniform electrical characteristics in every respect. A virtual ground array fabricated using a self-aligned salicidation process provides a compact cell with high access speed. The cell area is approximately 3F×2F where F is a given minimum dimension. For example, for 0.25 $\mu$m generation, the cell area is 0.56 $\mu m^2$, which is capable of yielding a 256 mb chip 1.3 cm on a side.

An advantage of the present invention is that it provides a method for fabricating memory cells for a memory array using self alignment techniques to allow scaling of the device, to eliminate source corner misalignment effect, and to provide cells having uniform electrical characteristics.

Another advantage of the present invention is that it provides a method for fabricating memory cells for a memory array having select gates for selecting one or more memory cells for program or erase operations.

Still another advantage of the present invention is that it provides a method for fabricating memory cells for a memory array requiring only low current for source side injection in programming the memory cells.

Yet another advantage of the present invention is that it provides a method for fabricating memory cells for a memory array that does not require high voltage on the source or bit line for the erase operation.

These and other features and advantages of the present invention will become well understood upon examining the figures and reading the following detailed description of the invention.

DRAWINGS

FIGS. 1a, 1b, and 1c show a table listing the steps in fabricating a preferred embodiment of the memory cells and array of the present invention.

DETAILED DESCRIPTION OF THE PREFERRED EMBODIMENTS

In a presently preferred embodiment of the present invention, a scaleable, compact, low current hash EPROM cell and memory array fabricated by using a twelve masks, triple-poly, salicided process are disclosed. Referring to FIGS. 1a, 1b, and 1c, a detailed listing of the steps for the fabrication of the memory array of the present invention is illustrated. In step 1, as part of the process in forming a triple well set-up (negative voltage on), deep n-wells are defined by using a p-Si substrate and growing initial oxide to about 2000 Å. Then, the defined areas for the formation of the n-well are masked and etched to expose these areas for doping. In step 2, implantation of phosphorous ions is performed and the ions are driven in at about 1100° C. to form the n-wells. In step 3, p-well regions are defined and doped for both the array area and the periphery by first masking the defined p-well regions, oxide etching these regions, and implanting the regions with boron. In step 4, n-well regions for the periphery (outside of the array) are defined and doped by a similar process of masking the defined regions, oxide etching these regions, and implanting the regions with boron. In step 5, a diffusion process is used for forming the n-wells and p-wells where corresponding dopants are driven into the respective wells, and the silicon is then made bare by oxide etching. In the next step, step 6, pad oxides are grown and nitride is deposited to define active areas. In step 7, boron field implantation is performed and local oxidation of silicon (LOCOS) is carried out to grow approximately 4000 Å of oxide. At this point, the bird's beaks are formed.

Figure 2:
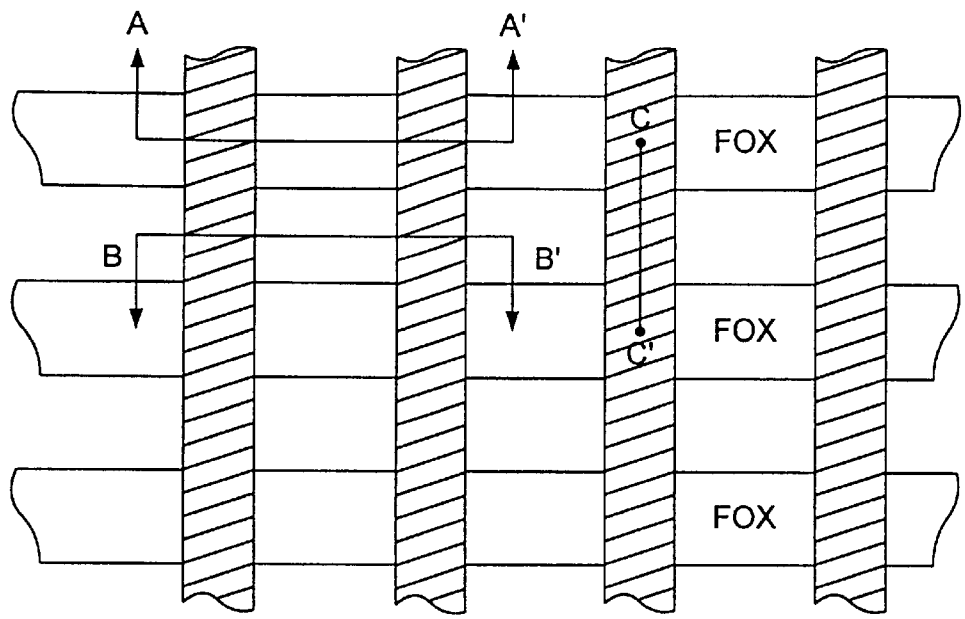
FIG. 2 illustrates a top view of the memory array of the preferred embodiment of the present invention.

After the field oxide is grown, in step 8, the oxide for insulating the floating gates are grown by first etching off the nitride and the pad oxide, and the gate oxide is grown to approximately 120 Å. In the next step (step 9), about 2000 Å of composite polysilicon is deposited and doped with phosphorous and about another 2000 Å of nitride is deposited in succession. In this manner, the floating gate poly is formed. In step 10, floating gate stripes are made by masking and etching the nitride and poly 1 in succession in the appropriate areas. FIG. 2 illustrates a top view of the memory array after this step, showing the floating gate stripes overlapping the field oxide (FOX) stripes. Additionally, three cross-sectional indicators, A–A', B–B', and C–C' are provided for reference purposes for later figures to illustrate the cross-sections of the physical structure of the memory array during the various stages of the fabrication process. The cross-sectional view as indicated by A–A' illustrates a cut-away view including both the FOX and the floating gate stripes; the cross-sectional view as indicated by B–B' illustrates the floating gate stripes in relation to the silicon; and the cross sectional view as indicated by C–C' illustrates the FOX and the bird's beak.

Figure 3A:
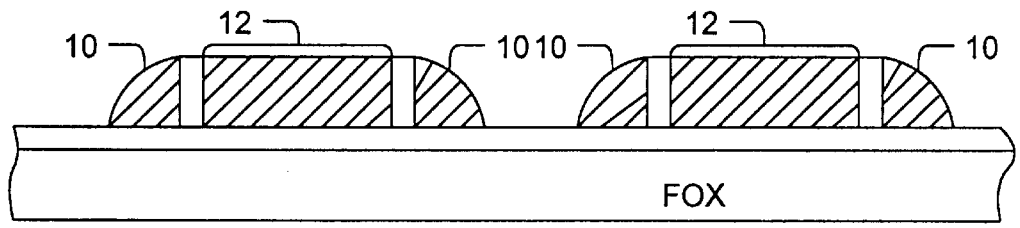
FIG. 3A illustrates a cross-sectional view of a memory cell of the preferred embodiment in forming the select gate stripes.
Figure 3B:
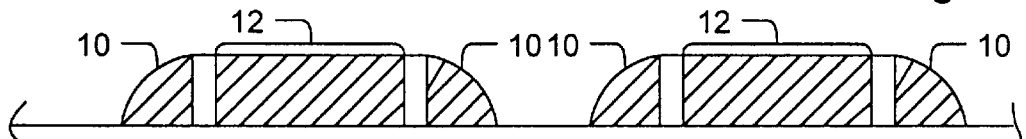
FIG. 3B illustrates another cross-sectional view of a memory cell of the preferred embodiment when forming the select gate stripes.
Figure 3C:
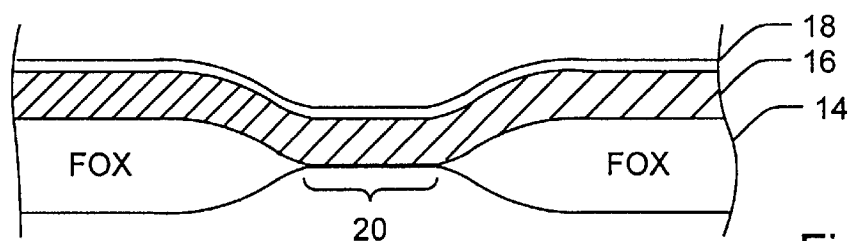
FIG. 3C illustrates yet another cross-sectional view showing FOX and bird's beaks.

Next, tunnel oxide and gate oxide for the select gate is grown. In this process, referring to step 11, oxide is thermally grown to produce about 300 Å on the polysilicon side walls and about 120 Å on the substrate due to the difference in doping levels in the silicon. Now, the threshold voltage Vt is adjusted for the select gate by masking the appropriate areas to perform boron implantation. Then, the select gate polysilicon is made (step 13) by depositing a polysilicon film of approximately 4000 Å and implanting phosphorous on the film. Next, in step 14, poly 2 (second polysilicon layer) spacers and their connecting pads are formed by masking the appropriate areas and performing reactive ion etching (RIE)-type of anisotropic etching on those areas. In this step, the periphery is covered with photo resist. The method for forming the select gate and the resulting structure is self-aligned to the floating gate and is of precise and uniform gate length. FIG. 3A illustrates a cross-sectional view (including FOX) of the memory cells after step 14 where there is a stripe of select gate 10 on each side of the floating gate 12. There is a layer of nitride deposited on the floating gate to serve as an etch stop. FIG. 3B illustrates another cross-sectional view in an area without the FOX where there is again a stripe of select gate 10 on each side of the floating gate 12. FIG. 3C illustrates a cross-sectional view of the bird's beak after this step showing the field oxide 14, the floating gate 16, and the nitride layer 18. The channel region is indicated at 20.

Figure 4A:
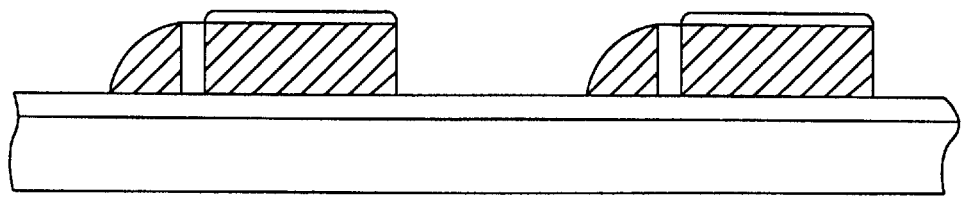
FIG. 4A illustrates a cross-sectional view of a memory cell of the preferred embodiment after removing the right side stripe and leaving the left stripe as the select gate stripe.
Figure 4B:
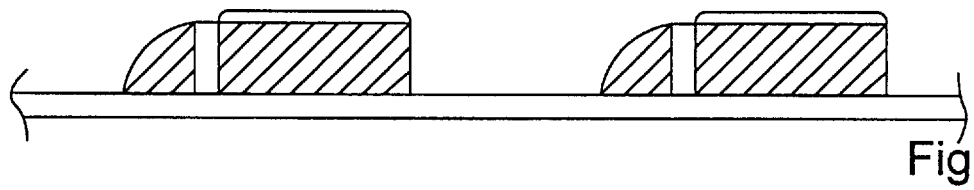
FIG. 4B illustrates another cross-sectional view of a memory cell of the preferred embodiment after removing the right side stripe and leaving the left stripe as the select gate stripe.
Figure 4C:
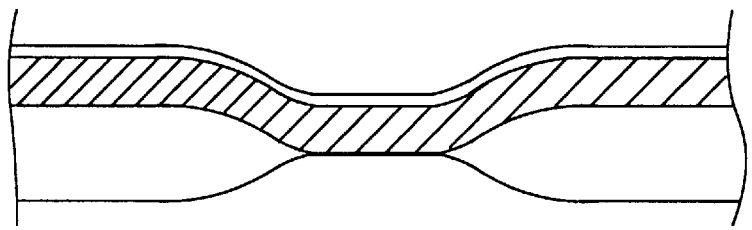
FIG. 4C illustrates yet another cross-sectional view showing FOX and bird's beaks after removing the right side stripe and leaving the left stripe as the select gate stripe.

In step 15, the right side poly 2 spacer is etched out by masking and performing isotropic poly etching of the desired areas (the CMOS areas are also covered). FIGS. 4A illustrates a cross-sectional view of the memory cell (including the FOX) after the stripe on the right has been removed. FIG. 4B illustrates a cross-sectional view in the active areas after the stripe on the right has been removed. Similarly, FIG. 4C illustrates the bird's beak after the removal of the stripe on the right side, noting that there has not been any changes from this view. In a self aligned method, using the floating gate and select gate as a mask, RIE oxide etching is then performed to remove the field oxide and expose the silicon (step 16).

Figure 5A:
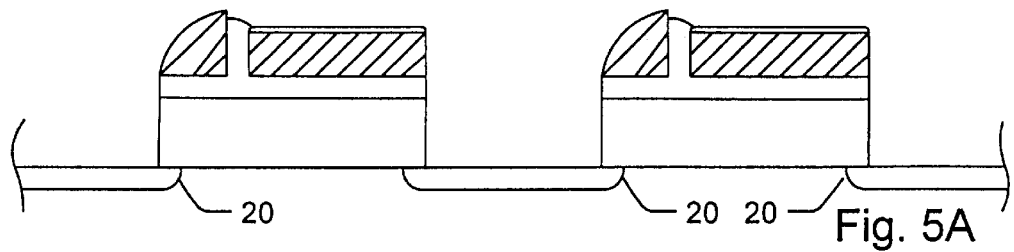
FIG. 5A illustrates a cross-sectional view of a memory cell of the preferred embodiment after doping the source and drain regions.
Figure 5B:
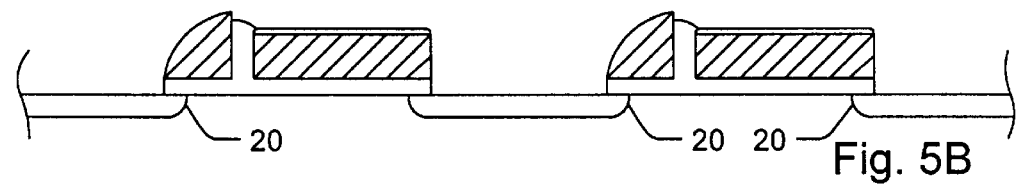
FIG. 5B illustrates another cross-sectional view of a memory cell of the preferred embodiment after doping the source and drain regions.
Figure 5C:
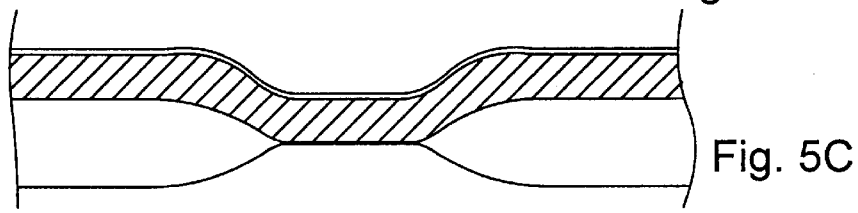
FIG. 5C illustrates yet another cross-sectional view showing FOX and bird's beaks after doping the source and drain regions.

After the silicon is made bare, the source and drain regions (within the array) can be made by arsenic implantation (step 17). FIGS. 5A and 5B illustrate the memory cell after the source and drain regions 20 have been formed. FIG. 5C illustrates the bird's beak of the LOCOS oxide after this step where the certain other field oxide areas were made bare for implanting the drain and source regions.

Figure 6A:
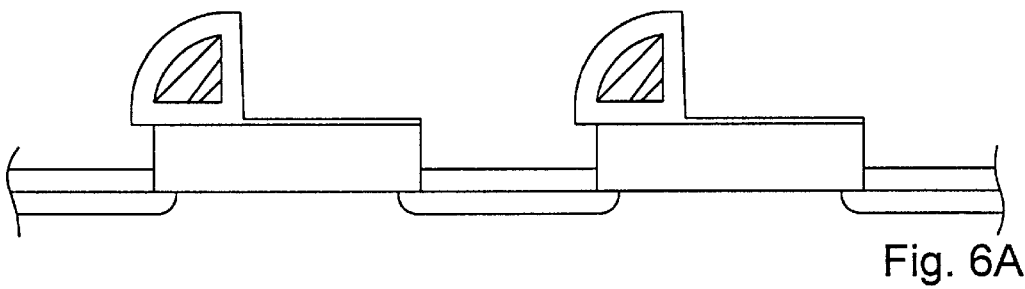
FIG. 6A illustrates a cross-sectional view of a memory cell of the preferred embodiment after the word line has been laid.
Figure 6B:
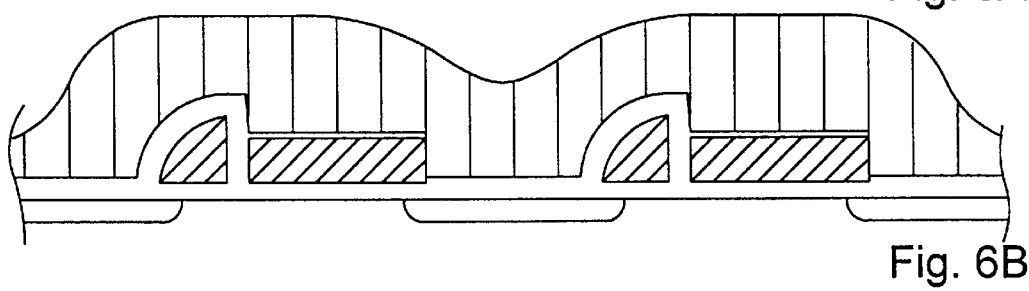
FIG. 6B illustrates another cross-sectional view of a memory cell of the preferred embodiment after the word line has been laid.
Figure 6C:
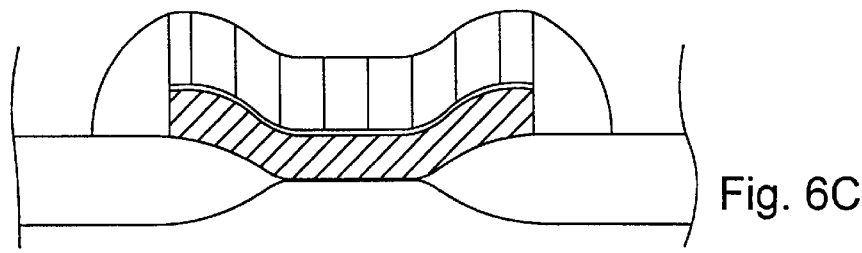
FIG. 6C illustrates yet another cross-sectional view showing FOX and bird's beaks after the word line has been laid.

In the next step (step 18), the select gate side wall oxides are thermally grown to about 1000 Å, and an additional oxide layer about 1000 Å is deposited and then RIE etched to form an oxide spacer. These two oxide layers help to protect the structure against etching so that in subsequent steps the select gate is still protected while the floating gate is being etched and patterned. Then, the floating gate surface is made bare by a phosphoric acid nitride etching process (step 19). In the next step, step 20, an inter-poly dielectric layer is formed by depositing a composite ONO film. In step 21, the word line (control gate) poly is formed by depositing a third layer of polysilicon (poly 3) having a thickness of about 2000 Å and an oxide layer grown for about another 1000 Å. In step 22, plasma etching is performed on the word line oxide (poly 3) and ONO, down to the floating gate surface. To form individual poly 1 islands (step 23), the same etching sequence continues to etch the floating gate, using the word line (control gate) as masks where the select gates are protected by oxide spacers. FIGS. 6A and 6B illustrate the physical structure of the memory cell after this step, and FIG. 6C illustrates the cross-sectional view of the bird's beak.

Next, n-channel gates are formed from poly 2 by covering the p-channel devices and performing RIE poly etching accordingly for the n-channel gates (step 24), and LDD implant of phosphorous ions is subsequently performed (step 25). In the next step, step 26, oxide spacers are formed for n-channel devices and floating gate edges by depositing about 1000 Å of oxide and a blanket RIE etching is performed. Next, the source and drain regions are formed for the n-channel devices by arsenic implantation (step 27). Note that since both the p-channel and memory areas are sealed in polysilicon, no masking step is necessary. Having now completed the n-channel devices, the p-channel devices can be formed by masking the n-channel devices and etching the poly gates for the p-channel devices (steps 28, 29, and 30). The source and drain regions for p-channel devices can be created by implanting $BF_2$ ions in the same manner.

To start the salication process forming C49 $TiSi_2$, a titanium film having a thickness of about 500 Å is deposited and rapid thermo annealing (RTA) is performed at about 500° C. in nitrogen (step 30). A wet chemical etching process is performed to remove unreacted Ti and RTA annealed at 750° C. to form C54 $TiSi_2$ over the word, source, and bit lines and the peripheral diffusion areas (steps 31 and 32). ILD is formed by depositing a layer of about 3000 Å of BPSF and using a reflow process (step 33). The contacts to the memory cells are formed by masking and oxide etching the appropriate areas (step 34). A layer of composite metal film (Ti/TiN/Al) is deposited for forming the metal lines (step 35), and a final masking and RIE etching of the areas for forming the metal lines is performed (step 36).

Figure 7:
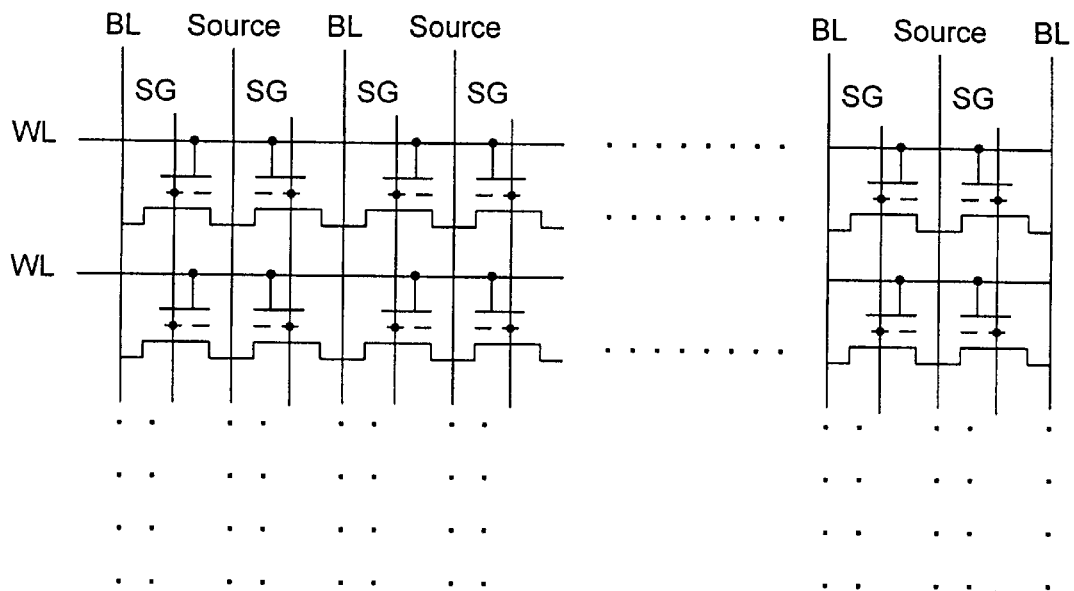
FIG. 7 shows a circuit layout of the memory array of the preferred embodiment of the present invention.
Figure 8:
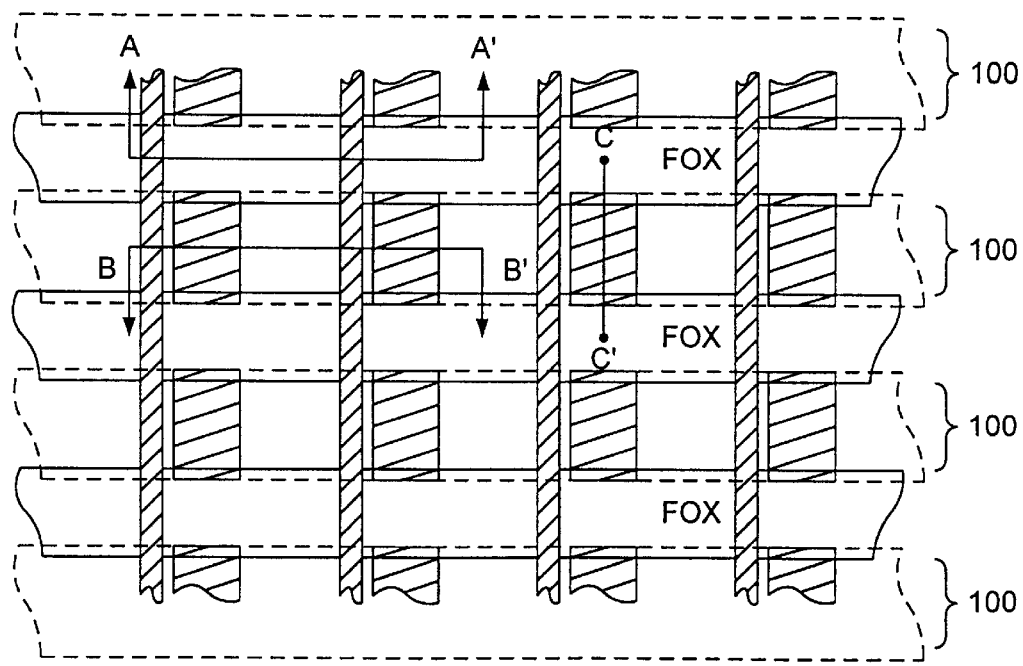
FIG. 8 illustrates a top view of the memory array structure after processing (control gates not shown).

A memory array fabricated using the above described process can be layout as shown in FIG. 7. In operating such a memory array, Table 1 lists the operating voltages for each respective line for performing the desired operations.

| Electrode | Operation | | | |
|---|---|---|---|---|
| | Program 1 (SSI) | Program 2 (CHE) | Erase | Read |
| WL Selected | 12 V | 5 V | −10 V | 4 V |
| SG Selected | 2 V | 5 V | 8 V | 4 V |
| Source Selected | 0 V | 0 V | F | 0 V |
| BL Selected | 5 V | 8 V | F | 2 V |
| WL Not-Selected | 0 V | 0 V | 0 V | 0 V |
| SG Not-Selected | 0 V | 0 V | 0 V | 0 V |
| Source Not-Selected | 0 V | 0 V | 0 V | 0 V |
| BL Not-Selected | 0 V | 0 V | 0 V | 0 V |

As is shown by Table 1, in operating the one or more memory cells, there are four lines associated with each of the memory cells, the word line or control gate (WL), select gate line (SG), source line, and the bit line (BL or drain line). One or more selected memory cells can be operated by properly applying the necessary voltage potential to the respective lines. For the non-selected memory cells, no voltage potential is needed at any of the lines.

In programming one or more selected memory cells using the source side injection method (SSI), referring to column 1 of Table 1, 12 V is placed on the word line, 2 V is placed on the select gate, 0 V is placed on the source line, and 5 V is placed on the bit-line. In programming selected memory cells using the CHE method, 5 V is placed on the word line, 5 V is placed on the select gate line, 8 V is placed on the bit-line, and the source-line is at 0 V. In the erase operation, 10 V is applied at the word line of the selected memory cell or cells, 8 V is placed on the select gate line, and the source and BL lines are floating. Note that single cell cross-point erasure is possible by addressing the respective select gate and control gate which is perpendicular to each other. In the read operation, 4 V is applied at the word line, another 4 V is applied at the select gate line, 2 V is applied at the bit-line, and no voltage potential is applied at the source line.

Note that the select gate is also used as an erase gate when conducting erase operations. An erase operation is achieved through FN tunneling of the electrons between the select gate and the floating gate.

Although the present invention has been described in terms of specific embodiments it is anticipated that alterations and modifications thereof will no doubt become apparent to those skilled in the art. It is therefore intended that the following claims be interpreted as covering all such alterations and modifications as fall within the true spirit and scope of the invention.

I claim:

1. A method for fabricating a selectable transistor, comprising the steps of:
    a) providing a substrate;
    b) defining a channel region;
    c) growing field oxide;
    d) providing a first insulating layer;
    e) defining a floating gate stripe generally placed over said channel region;
    f) providing a second insulating layer;
    g) defining a select gate generally placed on one side of said floating gate, said select gate being perpendicular to a control gate;
    h) implanting a drain region and a source region;
    i) providing a third insulating layer;
    j) said a control gate over said floating gate and said select gate; and
    k) etching said floating gate strip into isolated islands for each transistor.

2. A method as recited in 1 wherein said step e) includes the substeps of:
    1) depositing and doping a first polysilicon layer;
    2) masking, certain areas of said first polysilicon layer; and
    3) etching said first polysilicon layer to form said floating gate.

3. A method as recited in 1 wherein said step d) includes the step for selective doping said substrate to adjust the threshold voltage for said transistor.

4. A method as recited in claim 1 wherein in said implanting step said select gate and floating gate are used as a mask.

5. A method as recited in 1 wherein said step g) includes the substeps of:
    1) depositing and doping a second polysilicon layer over said second insulating layer;
    2) masking certain areas of said second polysilicon layer;
    3) etching said second polysilicon layer to form spacers adjacent to said floating gate and separate therefrom by said second insulating layer; and
    4) etching said spacers to leave a single spacer as said select gate.

6. A method as recited in 1 wherein said step j) includes the substeps of:
    1) depositing and doping a third polysilicon layer over said third insulating layer;
    2) masking certain areas of said third polysilicon layer; and 3) etching said third polysilicon layer to form the desired shape for said control gate.

7. A method as recited in claim 1 wherein said source region is generally disposed adjacent to said select gate.

8. A method as recited in claim 1 wherein said drain region is generally disposed adjacent to said floating gate.

9. A method as recited in claim 1 wherein said select gate is generally quarter-round in shape.

10. A method as recited in claim 1 wherein after said step e) further including a step of depositing a nitride layer on the top surface of said floating gate for protecting said floating gate.

11. A method as recited in claim 10 wherein after said step g) further including a step of removing said nitride layer.

12. A method as recited in claim 1 wherein before said step h) said floating gate and said select gate arc used as a self-aligned mask for etching said first insulating layer and said field oxide.

13. A method as recited in claim 1 wherein in said step k) an oxide spacer is provided to protect said select gate when etching said floating gate.

14. A method for fabricating a memory array comprising a plurality of rows and columns of interconnected memory cells wherein the word-line gates of memory cells in the same rows are connected by a common word-line and the select gates of the memory cells in the same columns are connected by a common select line, and the drain and source regions of memory cells in the same columns are commonly connected via respective drain lines and source lines, comprising the steps of:

a) providing a substrate;

b) defining an active area for each memory cell to be defined on said substrate;

c) growing field oxide;

d) providing a first insulating layer;

e) defining a plurality of floating gate stripes corresponding to the active areas;

f) providing a second insulating layer;

g) defining a plurality of select gate stripes each placed adjacent to one of said plurality of floating gate stripes;

h) forming a drain region and a source region associated with each of said floating gate stripe and said select gate stripe;

i) providing a third insulating layer;

j) depositing a plurality of word line stripes generally perpendicular to said select gate stripes and said floating gate stripes; and k) etching said floating gate stripes into isolated islands for each of said memory cells.

15. A method as recited in 14 wherein said step e) includes the substeps of:

1) depositing and doping a first polysilicon layer;

2) masking certain areas of said first polysilicon layer; and 3) etching said first polysilicon layer to form said floating gate stripes.

16. A method as recited in 14 wherein said step d) includes the step for selective doping said substrate to adjust the threshold voltage for the memory cells.

17. A method as recited in claim 14 wherein in said forming step said select gate and floating gate are used as a mask.

18. A method as recited in 14 wherein said step g) includes the substeps of:

1) depositing and doping a second polysilicon layer over said second insulating layer;

2) masking certain areas of said second polysilicon layer;

3) etching said second polysilicon layer to form spacer stripes adjacent to each of said floating gate stripes and separate therefrom by said second insulating layer; and 4) etching the spacer stripes to leave a single spacer stripe as said select gate stripe.

19. A method as recited in 14 wherein said step j) includes the substeps of:

1) depositing and doping a third polysilicon layer over said third insulating layer;

2) masking certain areas of said third polysilicon layer; and 3) etching said third polysilicon layer to form the desired shape for said word line stripes.

20. A method as recited in claim 14 wherein said drain region is generally disposed adjacent said floating gate stripes.

21. A method as recited in claim 14 wherein said source region is generally disposed adjacent said select gate stripes.

22. A method as recited in claim 14 wherein each of said select gate stripes is generally triangular in shape.

23. A method as recited in claim 14 wherein after said step e) further including a step of depositing a nitride layer on the top surface of each said floating gate stripe for protecting said floating gate stripes.

24. A method as recited in claim 23 wherein after said step g) further including a step of removing said nitride layer.

25. A method as recited in claim 14 wherein before said step h) said floating gate and said select gate are used as a self-aligned mask for etching said first insulating layer and said field oxide.

26. A method as recited in claim 14 wherein in said step k) an oxide spacer is provided to protect said select gate when etching said floating gate.

\* \* \* \* \*